United States Patent [19]

Hirai

[11] Patent Number: 5,311,341
[45] Date of Patent: May 10, 1994

[54] CONNECTION STRUCTURE BETWEEN A TAB FILM AND A LIQUID CRYSTAL PANEL

[75] Inventor: Minoru Hirai, Kyoto, Japan

[73] Assignee: Rohm Co., Ltd., Kyoto, Japan

[21] Appl. No.: 858,512

[22] Filed: Mar. 27, 1992

[30] Foreign Application Priority Data

Mar. 29, 1991 [JP] Japan .................. 3-092851

[51] Int. Cl.$^5$ ..................... G02F 1/133; G09F 9/00
[52] U.S. Cl. ................................ 359/88; 359/87
[58] Field of Search ............. 359/87, 88, 54; 361/398; 439/66, 67, 91; 257/668, 693

[56] References Cited

U.S. PATENT DOCUMENTS

| | | | |
|---|---|---|---|
| 4,431,270 | 2/1984 | Funada et al. | 359/88 |
| 4,640,581 | 2/1987 | Nakanowatari et al. | 359/88 |
| 4,767,189 | 8/1988 | Hayashi et al. | 359/88 |
| 4,842,373 | 6/1989 | Tomofuji et al. | 359/74 |
| 4,963,002 | 10/1990 | Tasuga et al. | 359/88 |
| 5,072,289 | 12/1991 | Sugimoto et al. | 257/701 |
| 5,161,009 | 11/1992 | Tanoi et al. | 359/81 |
| 5,212,576 | 5/1993 | Yoshioka | 359/88 |

FOREIGN PATENT DOCUMENTS

| | | | |
|---|---|---|---|
| 260141 | 3/1988 | European Pat. Off. | |
| 0267688 | 5/1988 | European Pat. Off. | 359/88 |
| 289026 | 11/1988 | European Pat. Off. | |
| 0091115 | 4/1989 | Japan | 359/88 |
| 0101517 | 4/1989 | Japan | 359/88 |
| 41150531 | 6/1991 | Japan | 359/88 |

Primary Examiner—William L. Sikes
Assistant Examiner—Tai V. Duong
Attorney, Agent, or Firm—Fay, Sharpe, Beall, Fagan, Minnich & McKee

[57] ABSTRACT

The improved liquid-crystal display device has a slit formed in part of the TAB area where the electrodes on the liquid-crystal display panel are connected to the output terminals on the TAB and the liquid-crystal display panel is bonded to the TAB by means of a first anisotropic conductive adhesive having a comparatively weak adhesive force, such as a thermoplastic anisotropic conductive adhesive, whereas a second anisotropic conductive adhesive having a comparatively strong adhesive force, such as a uv curable adhesive, is coated in the slit. This liquid-crystal display device can be produced by a process that proceeds basically as follows: the electrodes on the liquid-crystal display panel are connected to the output terminals on the TAB by means of a thermoplastic adhesive as the first anisotropic conductive adhesive having a comparatively weak adhesive force; then, the assembly is subjected to an operating test; if the TAB is found to be defective in the operating test, it is replaced and, if no defect is found, a uv curable or a thermosetting adhesive as the second anisotropic conductive adhesive having a comparatively strong adhesive force is coated in the slit and then cured as the output terminals are compressed against the electrodes.

29 Claims, 3 Drawing Sheets

CONNECTION STRUCTURE BETWEEN A TAB FILM AND A LIQUID CRYSTAL PANEL

BACKGROUND OF THE INVENTION:

This invention relates to a liquid-crystal display device and a process for producing the same. More particularly, this invention relates to an improvement of an assembly of liquid-crystal display panel in which a TAB as one of the IC mounting flexible resin films is connected to a liquid-crystal display panel. The invention also relates to a process for producing such an improved liquid-crystal display device.

The structure of a prior art liquid-crystal display panel is shown in FIG. 4. The liquid-crystal display device comprises basically a liquid-crystal display panel 1 having a plurality of electrodes 2 arranged in the end portion, a TAB 4 that has a liquid-crystal drive IC 5 mounted thereon and which also has a plurality of output terminals 3 arranged in the end portion (as lead wires on TAB 4), and an input circuit board. The output terminals 3 are connected to the electrodes 2 on the liquid-crystal display panel 1 by means of an anisotropic conductive adhesive 6. The output terminals 3 for the TAB 4 are formed on the obverse side of the TAB film (FIG. 4 shows the case where the lead wires are on the side opposite to the IC mounting side; in other cases, the lead wires may be on the reverse side).

Terminals on the input side (not shown) of TAB 4 are usually soldered to the output terminals on a board that is called either a column input circuit board or a row input circuit board. This input circuit board receives, via connectors or terminals, external signals for driving the electrodes (so-called X or Y electrodes) and supplies the input terminals on the liquid-crystal drive IC 5 with signals for driving the electrodes. In response to those signals, IC 5 generates and outputs signals for driving the respective electrodes that are connected in correspondence to the individual output terminals.

The liquid-crystal display panel 1 has a "column" panel which is such that part of the transparent electrodes arranged in the vertical direction (in column direction) is exposed at an end and a "row" column panel which is such that part of the transparent electrodes arranged in the horizontal direction (in row direction) is exposed at an end. These two panels have the liquid crystal held therebetween and are superposed in such a way that the sides where the transparent electrodes are formed (e.g., their electrode forming sides) face each other. The panels may be formed of such substrates as a glass substrate and a plastic film substrate. Part of the electrodes exposed at an end may be coated with a metal. All of such substrates are denoted by the word "panel" in the following description and the appended claims. The substrates are usually provided with a light polarizing plate on the outer surface.

FIG. 5 is a sketch illustrating the cross-sectional structure of the area where TAB 4 is connected to the liquid-crystal display panel 1. Arranged on the underside of TAB 4 are output terminals 3a, 3b, ... (in FIG. 4, these output terminals 3a, 3b, ... are collectively referred to as output terminals 3). Arranged on the surface of the end portion of the liquid-crystal display panel 1 are electrodes 2a, 2b, ... (in FIG. 4, these electrodes 2a, 2b, ... are collectively referred to as electrodes 2). TAB 4 is connected to the liquid-crystal display panel 1 by first placing them in superposition with the anisotropic conductive adhesive 6 interposed and with output terminals 3a, 3b, ... on the TAB 4 being positioned in registry with electrodes 2a, 2b, ... on the liquid-crystal display panel 1, and thereafter compressing the joined area under heating. As a result of this thermal compression, the anisotropic conductive adhesive 6 will cure to have the TAB 4 joined to the liquid-crystal display panel 1.

The anisotropic conductive adhesive 6 contains conductive particles 7 at a given density and, upon thermal compression, the conductive particles 7 will contact both the output terminal 3a and the electrode 2a which are disposed facing each other, whereby said output terminal and said electrode will conduct. Other facing combinations of output terminals and electrodes (e.g. the output terminal 3b and the electrode 2b) will conduct in a similar way via the conductive particles 7. However, adjacent output terminals (e.g. output terminals 3a and 3b) or adjacent electrodes (e.g. electrodes 2a and 2b) will not conduct. The density of the conductive particles 7 to be incorporated in the anisotropic conductive adhesive 6 is determined in such a way as to satisfy the above-described conditions. In the actual device, the pitch between output terminals 3 (3a, 3b, ...) and between electrodes 2 (2a, 2b, ...) is as small as ca. 0.25 mm (width, 0.125 mm; gap, 0.125 mm). Hence, very precise positioning and joining operations are required to establish connection between each output terminal and the corresponding electrode.

The anisotropic conductive adhesive 6 is made of a thermosetting epoxy or a thermoplastic polyester. The thermosetting anisotropic conductive adhesive provides high bond strength and insures high reliability in connection. However, even if some defect is found in an operating test following the joining process, the once bonded TAB is difficult to be disconnected from the liquid-crystal display panel, thereby making it considerably difficult for an operator to replace the defective TAB.

On the other hand, the thermoplastic anisotropic conductive adhesive usually has a comparatively weak bond strength, so it has the advantage that even if some defect is found in an operating test following the joining process, the defective TAB can be readily replaced. However, the thermoplastic anisotropic conductive adhesive has the disadvantage of low reliability in connection.

SUMMARY OF THE INVENTION

The liquid-crystal display device of the present invention has a liquid-crystal display panel having a plurality of electrodes arranged in the end portion and a TAB having a liquid-crystal drive IC mounted thereon, with a plurality of output terminals being provided on the surface of said TAB and connected to the corresponding electrodes on the liquid-crystal display panel. The device is characterized in that a slit is formed in part of the TAB area where the electrodes on the liquid-crystal display panel are to be connected to the output terminals on the TAB and that the liquid-crystal display panel is bonded to the TAB by means of a first anisotropic conductive adhesive having a comparatively weak adhesive force, such as a thermoplastic anisotropic conductive adhesive, whereas a second anisotropic conductive adhesive having a comparatively strong adhesive force, such as a uv curable adhesive, is coated in the slit.

This liquid-crystal display device of the present invention can be produced by a process that proceeds basically as follows: the electrodes on the liquid-crystal display panel are connected to the output terminals on the TAB by means of a thermoplastic adhesive as the first anisotropic conductive adhesive having a comparatively weak adhesive force; then, the assembly is subjected to an operating test; if the TAB is found to be defective in the operating test, it is replaced and, if no defect is found, a uv curable or a thermosetting adhesive as the second anisotropic conductive adhesive having a comparatively strong adhesive force is coated in the slit and then cured as the output terminals are compressed against the electrodes.

An advantage of this process is that at the stage of performing an operating test, the TAB can be readily disconnected from the liquid crystal display panel since the two members are joined together with the thermoplastic adhesive having a comparatively weak adhesive force. Hence, if the TAB is found to be defective, it can be readily replaced. If the TAB is found to be acceptible in the operating test, the uv curable or thermosetting adhesive having a comparatively strong adhesive force is coated in the slit in the TAB and cured as the output terminals on the TAB are compressed against the electrodes on the liquid-crystal display panel. Thus, the second adhesive applied into the slit adds to the strength of bonding between the electrodes on the liquid-crystal display panel and the output terminals on the TAB, thereby improving the reliability of connection to the display panel. As a consequence, the number of defective TABs is reduced to provide a liquid-crystal display device having a lower failure rate.

An object, therefore, of the present invention is to provide a liquid-crystal display device that has high reliability in connection between a liquid-crystal display panel and drive ICs and which hence has a lower failure rate.

Another object of the present invention is to provide a liquid-crystal display device that permits defective TABs to be replaced in an easy way.

DESCRIPTION OF THE PREFERRED EMBODIMENT

Figure 1A:
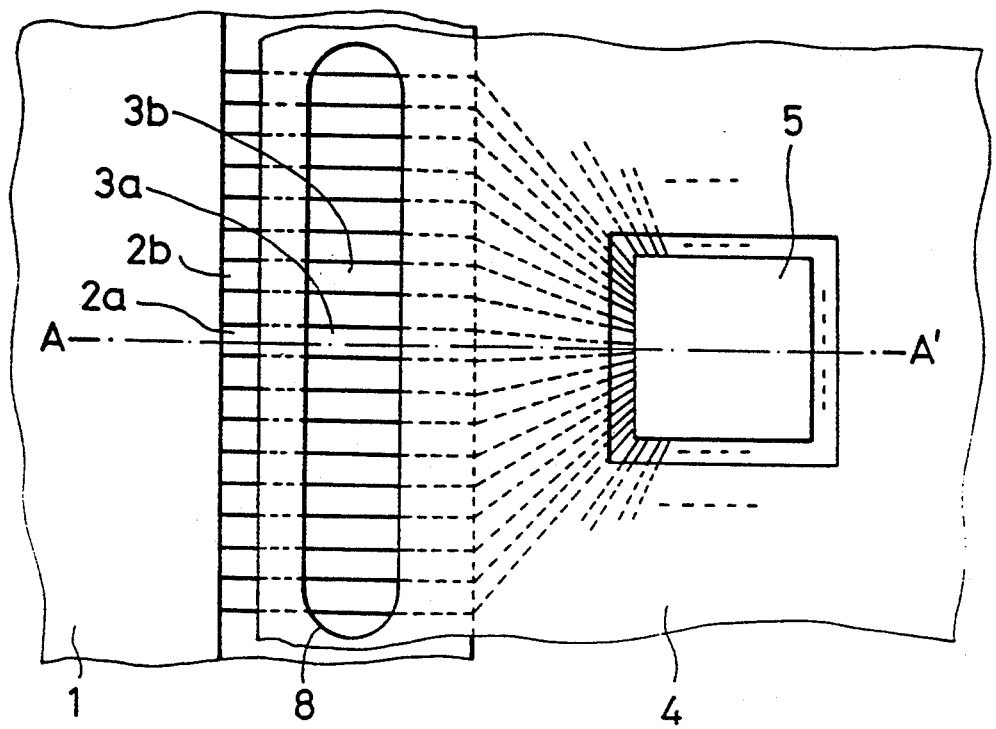
FIGS. 1(a) and 1(b) show a plan view and a cross section taken on line 1—1 respectively of an example of the liquid-crystal display device of the present invention before it is subjected to an operating test.
Figure 1B:
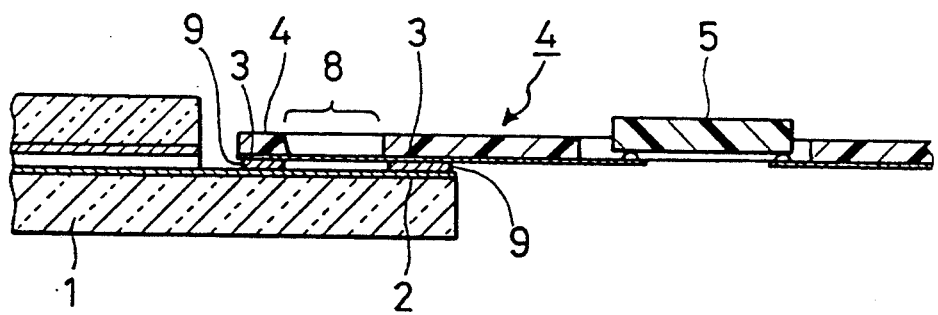
Figure 4:
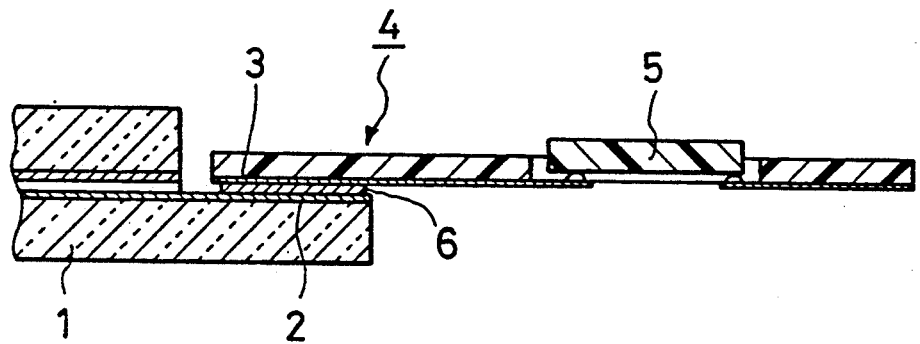
FIG. 4 is a sketch showing the structure of a prior art liquid-crystal display device.
Figure 5:
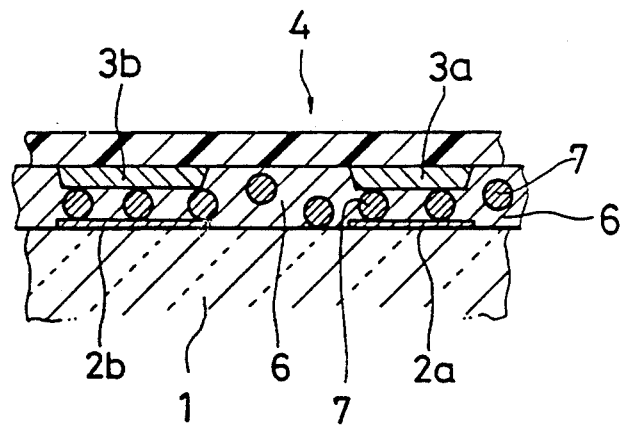
FIG. 5 is a sketch illustrating the cross-sectional structure of the area where the TAB and liquid-crystal display panel of the prior art liquid-crystal display device are connected to each other.

As shown in FIGS. 1(a) and 1(b) (referring to the state before conducting an operating test), the liquid-crystal display device according to an embodiment of the present invention has a slit 8 of a given width in part of the area where electrodes 2a, 2b, . . . on the liquid-crystal display panel 1 are to be connected to output terminals 3a, 3b, . . . on the TAB 4. This structural feature is clearly different from what is shown in FIG. 4 with respect to the prior art device. The slit 8 is provided in such a way that the output terminals 3 on the TAB 4 are exposed in that slit 8. The operation of connecting the output terminals 3 on the TAB 4 to the electrodes 2 on the liquid-crystal display panel 1 is performed in two successive steps. Another difference from the prior art device is that the conductive adhesive to be used in the first stage of connecting between electrodes and output terminals has a different bond strength than the adhesive to be used in the second stage and the latter is more powerful.

Figure 3:
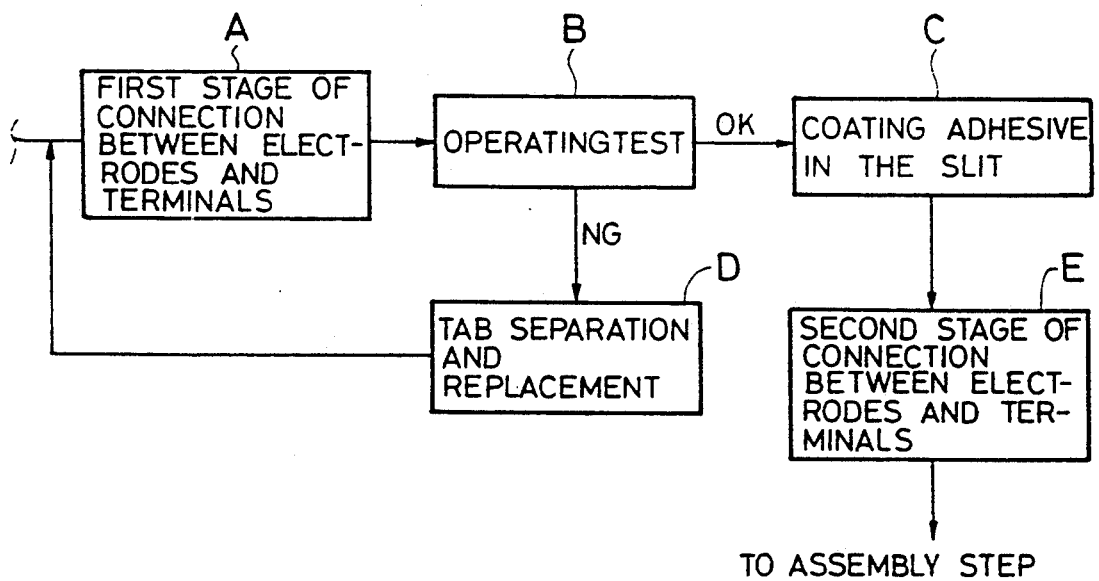
FIG. 3 is a diagram showing a process flow for the manufacture of a liquid-crystal display assembly as it relates basically to the step of connecting the liquid-crystal display panel to the TAB.

In the first stage of connection, the electrodes and the output terminals are connected by means of the thermoplastic anisotropic conductive adhesive as in the prior art. As already mentioned hereinabove, the bond strength of this adhesive is comparatively weak. The two members are connected in the same way as in the prior art, but the extent of connection does not cover the area corresponding to the slit 8. This connection step is identified by A in FIG. 3 and in this step, the electrodes and the output terminals are connected by means of the thermoplastic anisotropic conductive adhesive. Details of the connecting procedure are the same as in the prior art and, hence, omitted.

The assembly shown in FIG. 1 is such that this first stage of the connection step has been completed. This stage is followed by the step of performing an operating test on the liquid-crystal display device as identified by B in FIG. 3. Before the operating test, the liquid-crystal display device is such that the connection between the output terminals 3 on the TAB 4 and the electrodes 2a, 2b, . . . on the liquid-crystal display panel 1 has been completed except in the area corresponding to the slit 8. Thus, the output terminals 3a, 3b, . . . on the TAB 4 have already been connected to the corresponding electrodes 2a, 2b, . . . on the liquid-crystal display panel 1 by means of the thermoplastic anisotropic conductive adhesive 9, allowing the two members to conduct. As shown in FIG. 1(b), the slit 8 is provided in generally the central part of the connecting area so that there will be two connections by the anisotropic conductive adhesive 9, one being remote from the IC 5 on the TAB 4 and the other close to it.

In step B of performing the operating test, the liquid-crystal display device shown in FIG. 1 is brought to the operating test equipment and tested for its operation to see whether the liquid-crystal panel 1 will operate normally when it is driven with the IC on the TAB 4. It should be noted here that the state of connection between the electrodes and the output terminals on the liquid-crystal display device which has been subjected to the operating test in step B remains the same as shown in FIG. 1.

If the TAB is found to be defective (NG) in the operating test, the process goes to the separating/replacing step D, where said TAB is replaced. Since the TAB 4 is connected to the liquid-crystal display panel 1 by means of the thermoplastic anisotropic conductive adhesive 9 having a comparatively weak bond strength, the TAB 4 can be readily disconnected from the liquid-crystal display panel 1, whereby the defective TAB 4 can be replaced in an easy way. Following the replacement of the defective TAB 4, the process will return to the first stage A of the connection step.

Figure 2:
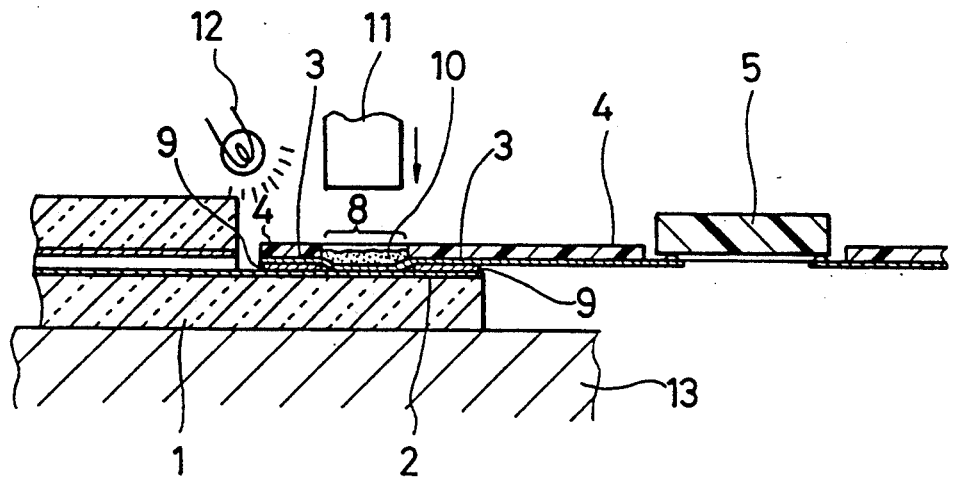
FIG. 2 is a sketch showing in cross section the state of connection between electrodes on a liquid-crystal display panel and output terminals on a TAB as they have been connected together in the second stage of the two-step connecting process according to an embodiment of the present invention.

If the TAB 4 is found to be acceptible (OK) in the operating test, the process goes to the adhesive coating step C, in which an adhesive having high bond strength such as a uv curable resin based adhesive 10 is coated in the slit 8. When this adhesive has been applied, the liquid-crystal display panel 1 has a relative position with the TAB 4 as shown in FIG. 2, except that a compressing apparatus 11, a light source 12 and a table 13 are not in fact positioned as shown in FIG. 2 right after the application of the adhesive 10.

The process then goes to the second stage E of the connection step. The device is placed on the table 13 of the connecting equipment and positioned as shown in FIG. 2. Then, the compressing apparatus 11 in the connecting equipment is actuated to descend towards the table 13 so that it exerts pressure on the area in the slit 8, whereby those portions of the output terminals 3 on the TAB 4 which are in the slit 8 are compressed against the corresponding portions of the electrodes 2 on the liquid-crystal display panel 1. Subsequent to or simultaneously with this compressing step, the light source 12 is lit so that it will apply a uv radiation towards the slit 8, whereupon the uv curable resin based adhesive 10 will cure. In FIG. 2, the output terminals 3 are shown to be in intimate contact with the electrodes 2 before they are compressed together but it should be noted that this presentation is selected simply because it is not clear how the gaps between the electrodes and output terminals are before they are compressed together after the application of the second adhesive.

Thus, the second adhesive applied into the slit 8 adds to the strength of bonding between the output terminals 3 on the TAB 4 and the electrodes 2 on the liquid-crystal display panel 1, thereby increasing the strength and, hence, reliability of the connection between the two members.

In the embodiment described above, the uv curable resin based adhesive is used in the second stage of the connection step but it may be replaced by a thermosetting adhesive. In this alternative case, the output terminals on the TAB are heated as they are compressed against the electrodes on the liquid-crystal display panel, whereby the thermosetting adhesive coated in the slit is allowed to cure. In this case, the light source 12 need not be used.

In the first stage A of the connection step, the electrodes 2 on the liquid-crystal display panel 1 and the output terminals 3 on the TAB 4 are connected in areas other than those corresponding to the slit 8. As regards those areas, the adhesive force of the first anisotropic conductive adhesive 9 and the open area of the slit 8 or its width are selected in such a way that the connected electrodes and output terminals can later be separated without being damaged. Usually, the slit width is advantageously about one half the width of the area of connection between the electrodes 2 and the output terminals 3 but it can be properly adjusted in accordance with the relationship between the strength of the first and second anisotropic conductive adhesives and the required reliability of connection. If the second anisotropic conductive adhesive has a particularly high bond strength, more efficient manufacture can be accomplished by reducing the adhesive force of the first anisotropic conductive adhesive while narrowing the width of the slit 8. In addition, if adequate electric conduction can be assured between the electrodes 2 and the output terminals 3 by bonding in the first stage of connection, the adhesive to be used in the second stage of connection need not be of an anisotropic conductive type but an ordinary insulating adhesive may be used.

What is claimed is:

1. A liquid-crystal display device comprising a liquid-crystal display panel having a plurality of electrodes arranged thereon as they are partly exposed at an end of said panel and a flexible film having an IC mounted thereon for driving at least one of said electrodes, said flexible film having at least one lead wire formed thereon serving as an output terminal for said IC, a slit being formed in a region of said flexible film which corresponds to an area of connection where said lead wire is to be connected to one of said electrodes, so that part of said lead wire is exposed in said slit, one of said electrodes and said lead wire being connected by a first adhesive of an anisotropic conductive type except in the area corresponding to said slit, said first adhesive of an anisotropic conductive type having such a weak adhesive force that one of said electrodes as connected to said lead wire can be separated without being damaged, the part of said lead wire which is exposed in said slit being connected to one of said electrodes by a second adhesive of either an insulating type or an anisotropic conductive type that has a greater adhesive force than said first adhesive of an anisotropic conductive type.

2. A liquid-crystal display device comprising a liquid-crystal display panel having a plurality of electrodes arranged thereon as they are partly exposed at an end of said panel and a flexible film having an IC mounted thereon that is connected to said electrodes for driving them, said flexible film having a plurality of lead wires formed thereon serving as output terminals for said IC, a slit being formed in a region of said flexible film which corresponds to an area of connection where said lead wires are to be connected to the respective electrodes, so that part of said lead wires are exposed in said slit, said electrodes and said lead wires being connected by a first adhesive of an anisotropic conductive type in the area of connection excepting the area corresponding to said slit, and the part of said lead wires which is exposed in said slit being connected to said electrodes by a second adhesive of either an insulating type or an anisotropic conductive type that has a greater adhesive force that said first adhesive of an anisotropic conductive type.

3. A liquid-crystal display device according to claim 2, wherein said IC mounting flexible film is a TAB and said first adhesive has such a weak adhesive force that any of the connected electrodes and terminals can be separated without being damaged.

4. A liquid-crystal display device according to claim 2, wherein said slit has a width that is selected in relation to the adhesive force of said first adhesive of an anisotropic conductive type in such a way that said electrodes and said lead wires, after being connected by said first adhesive of an anisotropic conductive type in said area of connection excepting the area corresponding to said slit, can be separated without being damaged.

5. A liquid-crystal display device according to claim 4, wherein the region where said electrodes are connected to said lead wires by the first adhesive of an anisotropic conductive type is divided into two parts.

6. A liquid-crystal display device according to claim 5, wherein said first adhesive of an anisotropic conductive type is thermoplastic whereas said second adhesive is of an anisotropic conductive type that is made of a uv curable resin.

7. In a liquid-crystal display device comprising a liquid-crystal display panel having a plurality of electrodes arranged in an end portion of the panel and a circuit board made of a flexible resin that has a liquid-crystal drive IC mounted thereon, a plurality of output terminals being provided on the surface of said circuit board and connected respectively to said electrodes, the improvement wherein a through slit is formed in said circuit board to expose at least part of said output terminals in the area where said circuit board is to be connected to said liquid-crystal display panel, said liquid-crystal display panel being connected to said circuit board by means of a thermoplastic anisotropic conductive first adhesive between said electrodes and said output terminals and by either a uv curable or a thermosetting second adhesive that is coated in said slit and separate from said first adhesive.

8. A liquid-crystal display device, comprising:
   a liquid-crystal display panel having a plurality of electrodes arranged thereon and partly exposed at at least one end of said panel;
   a wire supporting substrate having a plurality of lead wires formed thereon and aligned respectively with said electrodes;
   said lead wires being between said wire supporting substrate and said electrodes, and a through slit being formed in said wire supporting substrate to expose at least part of said lead wires;
   a first electrically conductive adhesive contactingly between said electrodes and said lead wires providing electrical conduction between respective aligned lead wires and electrodes without providing electrical conduction between electrodes and between lead wires; and
   a second adhesive separate from said first adhesive being within said slit, being contactingly between said part of said lead wires and aligned parts of said electrodes, and contacting said first adhesive.

9. The device of claim 8, wherein said wire supporting substrate is a flexible film.

10. The device of claim 8, wherein said second adhesive has a greater adhesive force than said first adhesive.

11. The device of claim 8, wherein said second adhesive is a thermosetting adhesive and said first adhesive is a thermoplastic adhesive.

12. The device of claim 8, wherein said first adhesive is a conductive adhesive and said second adhesive is a conductive adhesive.

13. The device of claim 8, wherein said slit is surrounded by said wire supporting substrate.

14. The device of claim 8, wherein for each pair of aligned lead wires and electrodes, said first adhesive is provided therebetween at portions spaced on opposite sides of said slit and said second adhesive joins said portions.

15. The device of claim 8, wherein said first adhesive is electrically conductive and said second adhesive is an insulating adhesive.

16. The device of claim 13, wherein for each pair of aligned lead wires and electrodes, said first adhesive is provided therebetween at portions spaced on opposite sides of said slit and said second adhesive joins said portions.

17. The device of claim 16, wherein said wire supporting substrate is a flexible film.

18. The device of claim 13, wherein said wire supporting substrate is a flexible film.

19. The device of claim 10, wherein said slit is surrounded by said wire supporting substrate.

20. The device of claim 19, wherein for each pair of aligned lead wires and electrodes, said first adhesive is provided therebetween at portions spaced on opposite sides of said slit and said second adhesive joins said portions.

21. The device of claim 10, wherein for each pair of aligned lead wires and electrodes, said first adhesive is provided therebetween at portions spaced on opposite sides of said slit and said second adhesive joins said portions.

22. The device of claim 17, wherein said second adhesive has a greater adhesive force than said first adhesive.

23. An electronic display device, comprising:
   a display substrate having a plurality of electrodes arranged thereon and partly exposed at at least one end of said substrate;
   a wire supporting substrate having a plurality of lead wires formed thereon and aligned respectively with said electrodes;
   said lead wires being between said wire supporting substrate and said electrodes, and a through slit being formed in said wire supporting substrate to expose at least part of said lead wires;
   a first electrically conductive adhesive contactingly between said electrodes and said lead wires providing electrical conduction between respective aligned lead wires and electrodes without providing electrical conduction between electrodes and between lead wires; and
   a second adhesive separate from said first adhesive being within said slit, being contactingly between said part of said lead wires and aligned parts of said electrodes, and contacting said first adhesive.

24. The device of claim 23, wherein said second adhesive has a greater adhesive force than said first adhesive.

25. The device of claim 24, wherein said wire supporting substrate is a flexible film.

26. The device of claim 25, wherein said slit is surrounded by said wire supporting substrate; and
   for each pair of aligned lead wires and electrodes, said first adhesive is provided therebetween at portions spaced on opposite sides of said slit and said second adhesive joins said portions.

27. The device of claim 23, wherein said wire supporting substrate is a flexible film.

28. The device of claim 23, wherein said slit is surrounded by said wire supporting substrate.

29. The device of claim 28, wherein for each pair of aligned lead wires and electrodes, said first adhesive is provided therebetween at portions spaced on opposite sides of said slit and said second adhesive joins said portions.

* * * * *